(12) United States Patent
O'Flaherty et al.

(10) Patent No.: US 7,834,688 B2
(45) Date of Patent: Nov. 16, 2010

(54) LINEARISED POWER AMPLIFIER

(75) Inventors: Martin O'Flaherty, Bishops Stortford (GB); Graham Dolman, Saffron Walden (GB); Colin McGregor, Edinburgh (GB)

(73) Assignee: Nortel Networks Limited, St. Laurent, Quebec (CA)

( * ) Notice: Subject to any disclaimer, the term of this patent is extended or adjusted under 35 U.S.C. 154(b) by 7 days.

(21) Appl. No.: 11/960,988

(22) Filed: Dec. 20, 2007

(65) Prior Publication Data

US 2009/0160549 A1 Jun. 25, 2009

(51) Int. Cl.
*H03F 1/26* (2006.01)
(52) U.S. Cl. ....................... 330/149; 330/151
(58) Field of Classification Search ................. 330/149, 330/151
See application file for complete search history.

(56) References Cited

U.S. PATENT DOCUMENTS 5,789,976 A * 8/1998 Ghannouchi et al. .......... 330/52
6,522,198 B2 * 2/2003 Ahn ........................... 330/149
6,680,649 B2 * 1/2004 Rydin ......................... 330/149

* cited by examiner

*Primary Examiner*—Steven J Mottola
(74) *Attorney, Agent, or Firm*—Barnes & Thornburg LLP

(57) ABSTRACT

A linearized power amplifier including a predistorter and a feedforward circuit is described. By using both a predistorter and a feedforward cancellation system the linearization of the amplifier is increased. The accuracy of the amplified signal may be further improved by training the predistorter using the error signal produced by the feedforward cancellation system. Improved accuracy in the linearizer results in a reduction in the power requirement of the error amplifier and a relaxation in the phase, amplitude and delay accuracy of the feedforward loop.

10 Claims, 5 Drawing Sheets

LINEARISED POWER AMPLIFIER

FIELD OF THE INVENTION

This invention relates to the amplification of signals and the improved linearisation of amplifiers. This invention is applicable to use within communications apparatus such as cellular base stations.

BACKGROUND OF THE INVENTION

In many applications an amplifier is used to increase the power of an input signal. However, during amplification, errors are introduced into the signal. For example, ideally an amplifier will be linear but amplifiers are generally only linear within certain limits resulting in clipping and distortion. For this reason, various mechanisms have been developed to compensate for the non-linearity of an amplifier to increase the limits within which a linear response can be obtained. Two known methods of compensating for the introduction of errors are feedforward linearisation and predistortion.

An example of a known feedforward system, 10, is illustrated in FIG. 1. In this feedforward system 10, the input signal 12 is split into a main signal 14 and a reference signal 16. The main signal passes to a main amplifier 22 where it is amplified. The signal output of the amplifier includes, in addition to the amplified main signal 14, any distortion introduced by the amplifier 22. Once the main signal 14 has been amplified it is sampled and subtracted from the reference signal (at 28) to produce an error signal 30. The error signal 30 ideally only contains errors introduced by the main amplifier 22 when processing the main signal 14. In order to achieve this the main signal and reference signal must be precisely aligned in time and amplitude when they are combined. To achieve this alignment a delay circuit 18 is present in the reference signal path.

The error signal 30 can then be amplified using an error amplifier 32 and subtracted from the output of the main amplifier 22 to remove the errors present in the main amplifier's output 24. Again this requires precise synchronising of the signals to ensure that the error is accurately removed from the signal.

As will be understood by the skilled person one of the main disadvantages of feedforward correction arises from the relatively large distortion from the power amplifier. As the introduced distortion is large a large error amplifier is required to handle the error signal. Additionally, the feedforward loop's gain, phase and delay must be very accurately matched in order to achieve the high levels of cancellation required to reduce the distortion to comply with typical spectral emissions masks. To realise this accuracy often requires the use of additional hardware (pilot tone receivers etc) which further adds to cost and complexity.

An example of a known predistortion system 40 is illustrated in FIG. 2. In a predistortion system the input signal first passes through a predistorter 42 where it is combined with predistortion coefficients that inversely model the amplifier's gain and phase distortion characteristics. The signal then passes through a DAC 44, an up-converter 46 to a power amplifier 48 where it is amplified. The processing by the predistorter means that any errors introduced by the amplifier have already been compensated for in the signal. Optionally, an up-converter (not shown) may be present between the DAC and power amplifier.

The resultant signal may also be used to train the predistorter using a feedback loop 50, including an ADC 46, so that it more accurately models the amplifier's characteristics. This results in greater accuracy in the cancellation of any errors introduced by the amplifier 48. In this way the linearity of the system can be further improved. Optionally, the feedback loop 50 may also include a down-converter (not shown).

In classical predistortion systems the bandwidth of the components in the system are generally required to be at least five times the desired bandwidth of the output signal. Additionally, the components generally have high dynamic range to ensure spectral masks for the output signals are met. To meet these requirements the DSP and DACs used within the power amplifier have a relatively high power consumption and are costly.

Communication systems using multi-carrier signals are particularly challenging for a predistortion system as they have increased dynamic range and bandwidth. Current predistortion systems cannot meet the stringent spectral emissions masks for multi-carrier GSM. It is therefore desirable to further minimise the distortion introduced during the amplification process and improve the efficiency of the linearisation process further.

SUMMARY OF THE INVENTION

According to a first aspect of the present invention there is provided apparatus for amplifying a signal comprising, an input arranged to receive an input signal, means to split the input signal into a main signal and a reference signal, a predistorter to process the main signal, an amplifier to amplify the main signal, processing means to subtract the reference signal from a sample of the main signal to produce an error signal representative of residual errors in the main signal after amplification, means to sample the error signal and processing means to train the predistorter using the sampled error signal. By training the predistorter using an error signal a lower power error down-converter and ADC can be used.

Optionally, the apparatus includes an error amplifier to amplify the error signal and a comparator arranged to subtract the error signal from the main signal to produce an output signal.

Additionally, by closing the loop to the error cancellation point the predistorted signal compensates for gain, phase and delay changes in the amplifier and forces the error to the minimum possible value achievable using the predistorter. This minimises the power handling requirement of the feed forward error amplifier and reduces the requirement for separate stabilisation or compensation means thus allowing lower complexity and cheaper designs to be utilised. Lower power and complexity in the feedforward error path means that the main path delay can be minimised. Minimising the main path delay reduces the signal power losses and improves the overall efficiency.

Optionally, the apparatus may include a filter arranged to filter the reference signal before it is subtracted from the main signal by the processing means. This positioning of the filter allows high selectivity filters to be used as at this point there is a high tolerance to insertion loss. Additionally, the insertion of filters at this point is advantageous as it removes the need to filter the output of the power amplifier meaning that the filter does not have to handle the full output of the power amplifier and the insertion loss of the filter does not reduce the output power of the amplifier. The amplifiers can be inserted at this point because the presence of a feedforward correction means that the output of the power amplifier will match the filtered reference. The filter may be, for example, a band-pass filter.

The apparatus may further include a low resolution digital-analogue converter (DAC) to process the main signal after it is processed by the predistorter but before it is amplified. Normally, the DAC used at this point must simultaneously meet the 5 times signal bandwidth (required for pre-distortion of the $3^{rd}$ and $5^{th}$ order intermodulation products generated by the power amplifier's distortion) and the required dynamic range to be fully compliant with the spectral emissions masks. However, by using feedforward cancellation the system has a lower dynamic range requirement due to the action of feedforward cancellation at the power amplifier output.

Optionally, a low dynamic range error analogue-to-digital converter may be used to process the sampled error signal. Additionally, a low dynamic range down converter may be used to process the sampled error signal.

In one variation the input is a wideband signal comprising multiple signals which may be of multiple standards including: GSM, UMTS, LTE, WiMAX etc. . . . . .

According to a second aspect of the present invention there is provided a method of amplifying a signal comprising the steps of: receiving an input signal, splitting the input signal into a main signal and a reference signal, processing the main signal in a predistorter, amplifying the main signal, combining a sample of the main signal with the reference signal to produce an error signal representative of residual errors in the main signal after amplification, sampling the error signal and training the predistorter using the sampled error signal.

According to a third aspect of the present invention there is provided a computer program stored on a computer readable medium and arranged to implement a method of amplifying a signal comprising the steps of receiving an input signal, splitting the input signal into a main signal and a reference signal, processing the main signal in a predistorter, amplifying the main signal, combining a sample of the main signal with the reference signal to produce an error signal representative of residual errors in the main signal after amplification, sampling the error signal, and training the predistorter using the sampled error signal. The method may be implemented, for example, using an application specific integrated circuit, a field-programmable gate array or any other suitable means.

BRIEF DESCRIPTION OF THE DRAWINGS

Other aspects and features of the present invention will become apparent to those ordinarily skilled in the art upon review of the following description of specific embodiments of the invention in conjunction with the accompanying figures.

DETAILED DESCRIPTION OF PREFERRED EMBODIMENTS

Figure 1:
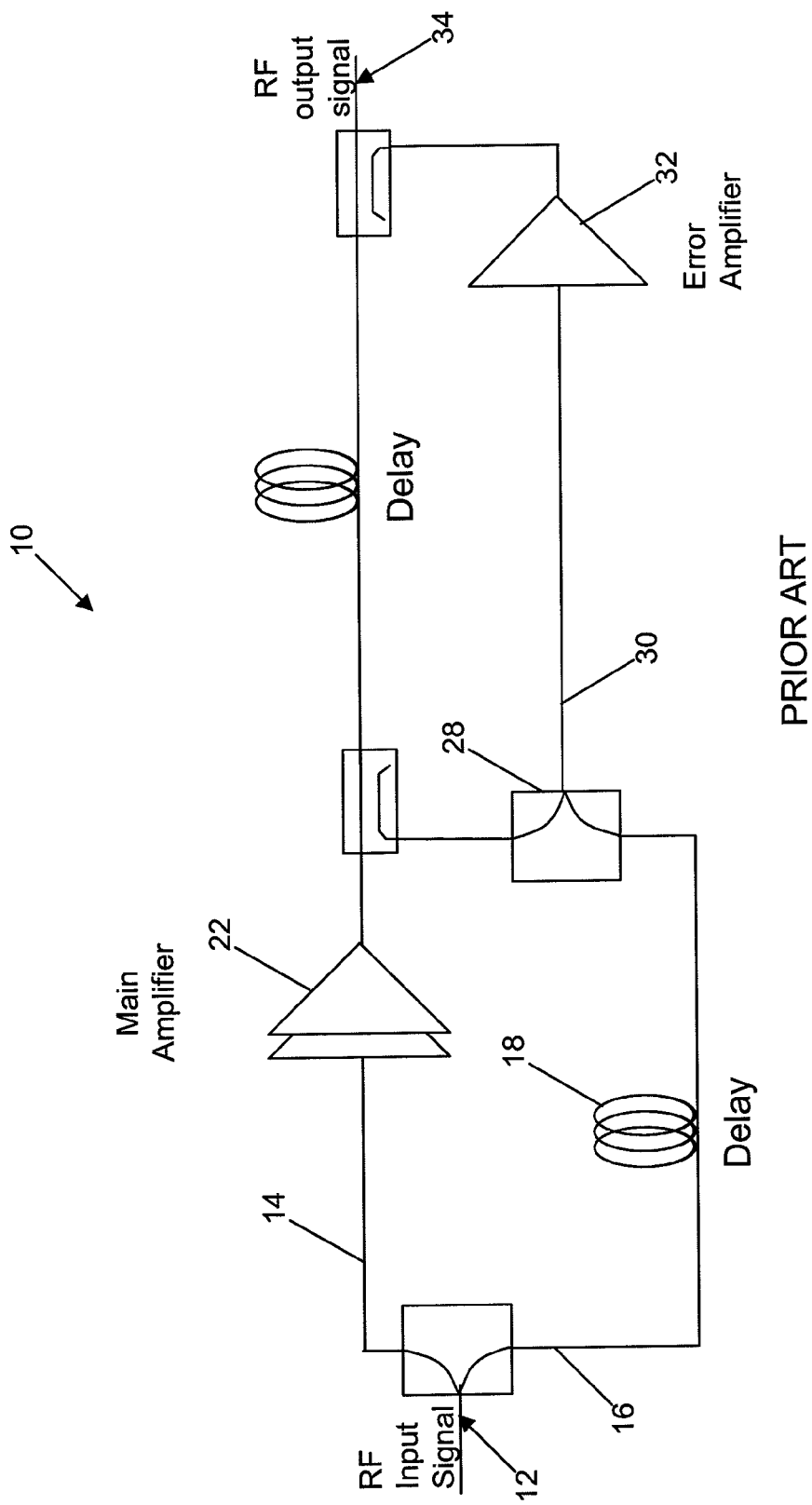
FIG. 1 illustrates a prior art feedforward system.
Figure 2:
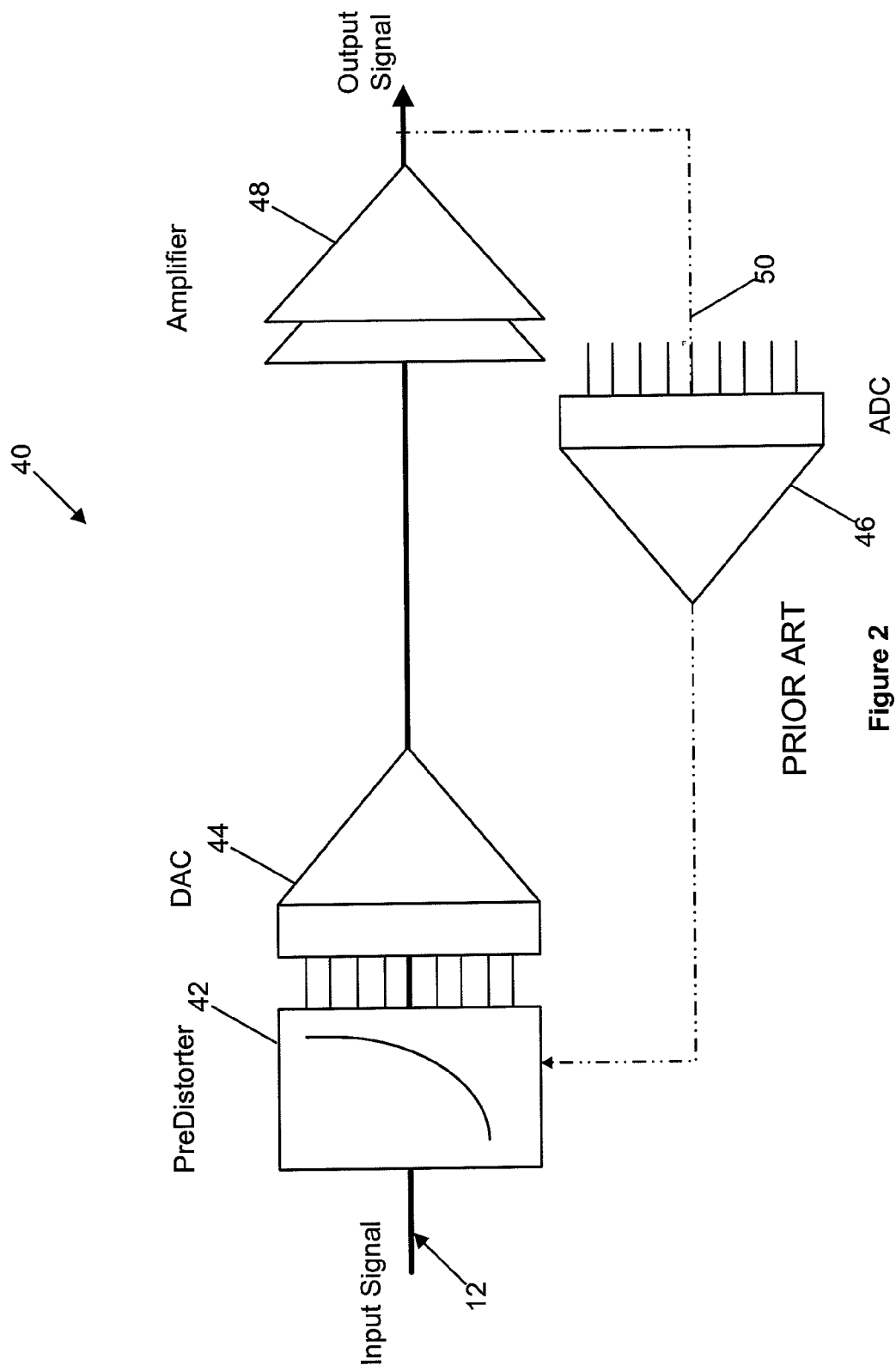
FIG. 2 illustrates a prior art predistortion system.

An embodiment of the present invention is described with reference to FIG. 3. An amplification system 60 comprises a predistortion system 62 and a feedforward cancellation system 64 connected in series with a main amplifier 66. The predistortion system comprises a predistorter 68, DAC 70, and up-converter 72 situated in series before the main amplifier 66.

The feedforward cancellation system 64 comprises a reference DAC 74 and reference upconverter 76 for a reference signal. The feedforward cancellation system 64 also includes a sampler 78, a comparator 80.

A digital baseband input signal entering the amplification system 60 is first split into a main signal and a reference signal. The main signal is transmitted down a path to the predistorter 68 where it is processed using coefficients representing the inverse characteristics of the main amplifier 66 as known in the art. Once the main signal has been processed by the predistorter 68 it is transmitted through the main DAC 70, the up-converter 72 and then to the main amplifier 66. At the main amplifier 66 the main signal is amplified and the characteristics introduced by the predistorter 68 are, in effect, cancelled out by the characteristics of the main amplifier.

At the same time the reference signal is passed through the reference DAC 74 and the up-converter 76 to produce a signal to be compared to the processed main signal.

Optionally, as the feedforward cancellation causes the output signal to match the reference signal at a higher power, filters (not shown) required for the output to meet spectral emission masks can be inserted into the transmission path of the reference signal. The insertion of high performance filters at this point is advantageous because the filter does not have to withstand the high power of the output signal resulting in a high insertion loss being tolerated at this point.

After the main signal has been amplified it is sampled in sampler 78. The sampled signal is then passed to a comparator 80 which determines the difference between the reference signal (signal before amplification) and the main signal (signal after amplification). The resultant signal that encodes the difference is known as the error signal.

In order to improve the accuracy of predistorter 68 the error signal is fed back to the predistorter 68 and used to train the predistorter 68 in order that it more accurately modulates the main signal to compensate for the main amplifier's characteristics. Before the sampled error signal reaches the predistorter 68 it is preferably passed through a down-converter 88 and ADC 90 to produce a digital representation of the errors introduced by the main amplifier 66 which are not cancelled out by the predistorter 68. The digital representation of the remaining errors is fed back into the predistorter 68 in order to train the predistorter 68.

The training of the predistorter 68 using a signal representing the errors alone is advantageous because it reduces the dynamic range requirement of the error ADC because no main signal is present.

Figure 3:
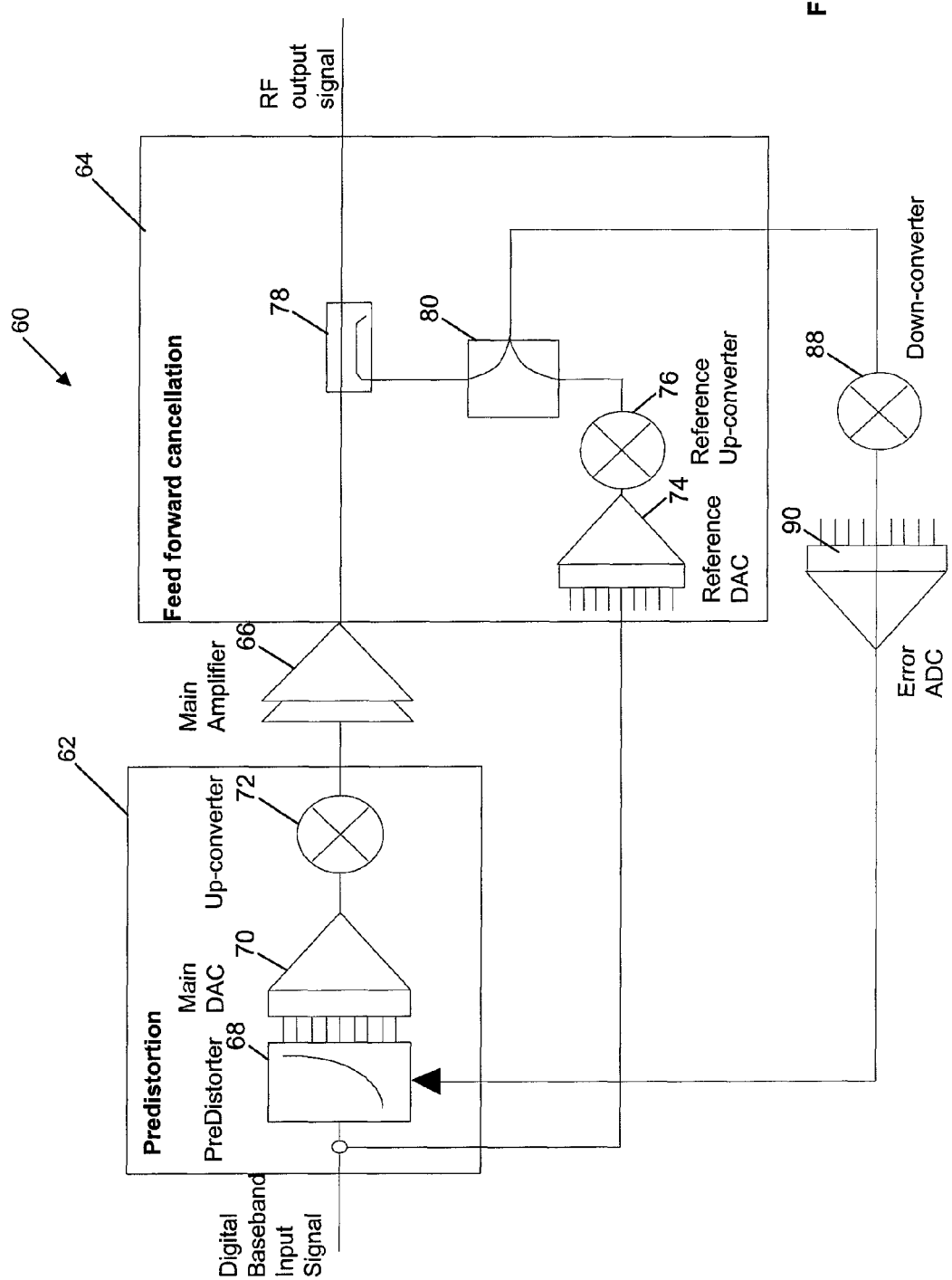
FIG. 3 illustrates a linearisation circuit in accordance with an embodiment of the present invention.
Figure 4:
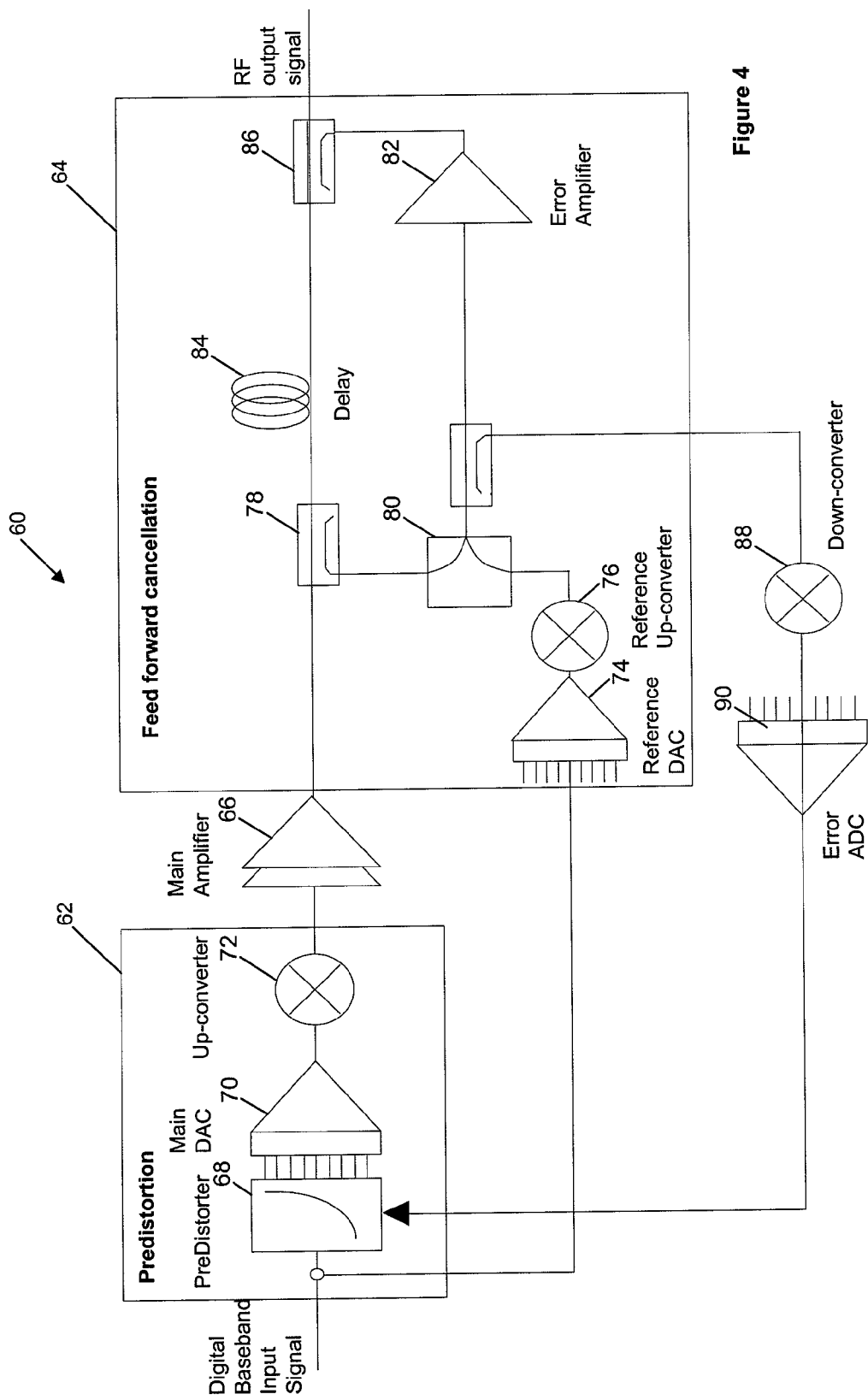
FIG. 4 illustrates a linearisation circuit in accordance with another embodiment of the present invention.

FIG. 4 illustrates another embodiment of the present invention. In this embodiment the system is set up as described with reference to FIG. 3 above. However, the feedforward cancellation system 64 also includes an error amplifier 82, a delay circuit 84 and an error coupler 86.

The error signal is passed to an error amplifier 82 where it is amplified. This means that the errors encoded by the error signal are of similar magnitude to the errors present in the amplified main signal.

The error signal is then passed to another comparator 86 in which the error signal is subtracted from the amplified main signal to further reduce the errors present in the main signal. The main signal is delayed using any suitable means in order that the main signal and error signal are synchronised. The resulting signal can then be output from the amplification system.

The error signal is also sampled before it reaches the error amplifier 82 and it is this sampled error signal which is used to train the predistorter 68.

By training the predistorter on error signal, the error is forced to be as small as it can possibly be. Minimising the error signal means that a smaller error amplifier may be used which in turn means less delay (and therefore power loss) is required in the main signal path. Reduction of the error signal also means that the accuracy of the phase and amplitude match in the feed forward error loop can be greatly reduced whilst still maintaining the required output spectral emissions.

Figure 5:
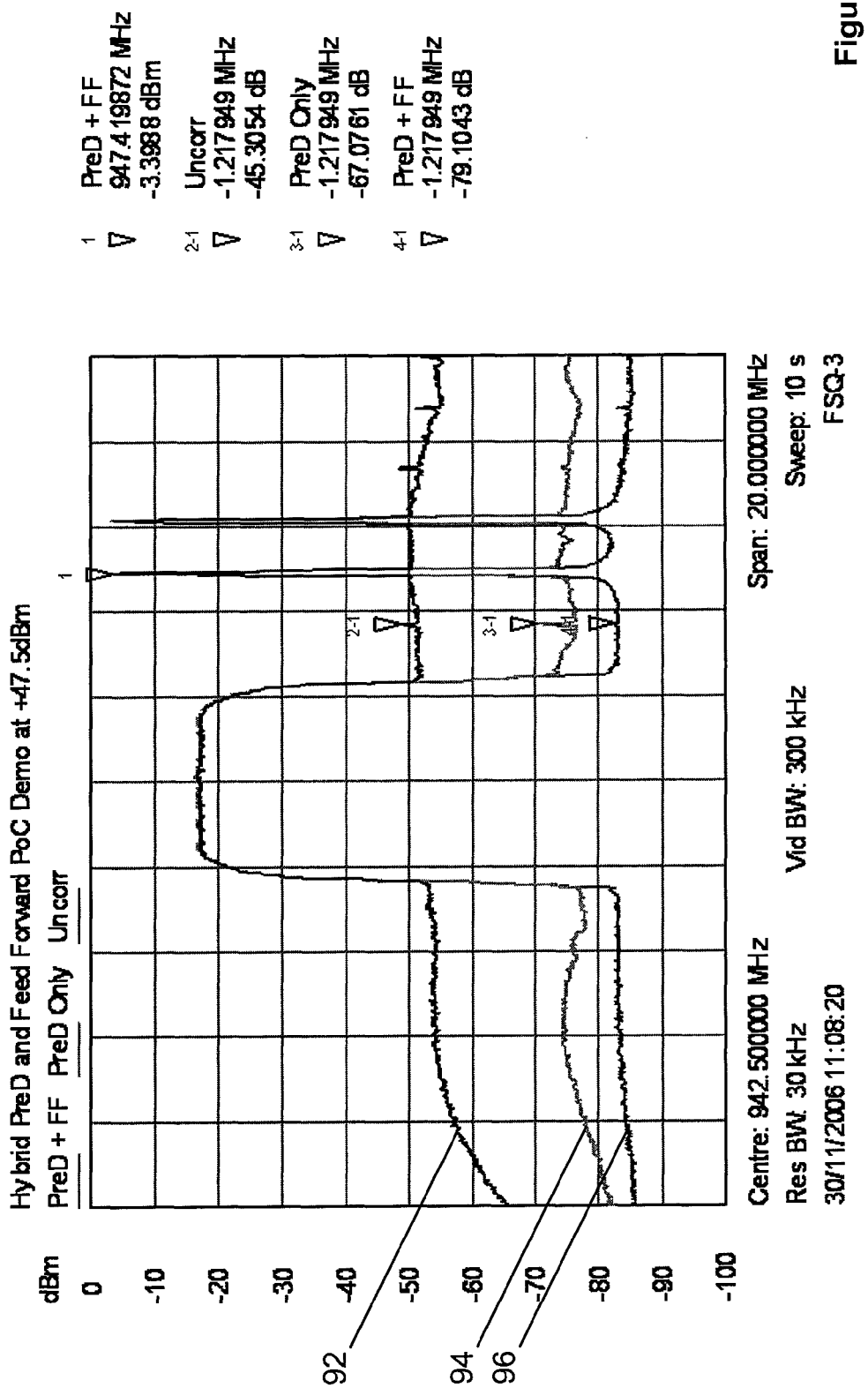
FIG. 5 is a graph illustrating the output signals obtained with different types of signal processing.

FIG. 5 shows the output signals obtained using an amplifier having no correction for non-linearity (signal 92), having the structure shown in FIG. 3 (signal 94) and having the structure shown in FIG. 4 (signal 96). As can be seen the base line of the amplifier operating with no correction is much greater than the base line obtained using amplifiers including a predistorter or the system of the present invention.

What is claimed is:

1. Apparatus for amplifying a signal comprising:
   a) an input to receive an input signal;
   b) a splitter to split the input signal into a main signal and a reference signal;
   c) a predistorter to process the main signal;
   d) an amplifier to amplify the main signal to produce an amplified main signal;
   e) a processor to subtract the reference signal from a sample of the main signal to produce an error signal representative of residual errors in the main signal after amplification;
   f) a trainer to train the predistorter to more accurately model the amplifier's characterstics, the trainer training the predistorter using the error signal;
   g) an error amplifier to amplify the error signal to produce an amplified error signal; and
   h) a differentiator to subtract the amplified error signal from the amplified main signal to produce an output signal.

2. The apparatus of claim 1 further including a filter to filter the reference signal before it is subtracted from the main signal by the processor.

3. The apparatus of claim 2 wherein the filter is a band-pass filter.

4. The apparatus of claim 1 further including a sampler to sample the error signal and wherein the trainer trains the predistorter using the error signal sample.

5. The apparatus of claim 1 further including a low resolution digital-analogue converter to process the main signal after it is processed by the predistorter but before it is amplified.

6. The apparatus of claim 4 further including a low dynamic range error analogue-to-digital converter to process the sampled error signal.

7. The apparatus of claim 4 further including a low dynamic range down converter to process the sampled error signal.

8. The apparatus of claim 1 wherein the input signal is a wideband signal including the combination of an OFDM carrier and at least one GSM carrier.

9. A method of amplifying a signal comprising the steps of:
   a) receiving an input signal;
   b) splitting the input signal into a main signal and a reference signal;
   c) processing the main signal in a predistorter;
   d) amplifying the main signal to produce an amplified main signal;
   e) combining a sample of the main signal with the reference signal to produce an error signal representative of residual errors in the main signal after amplification; and
   f) training the predistorter to more accurately model the amplifier's characteristics, the predistorter being trained using the error signal;
   g) amplifying the error signal to produce an amplified error signal; and
   h) subtracting the amplified error signal from the amplified main signal to produce an output signal.

10. A computer program stored on a non-transitory computer readable medium and arranged to implement a method of amplifying a signal when executed on a computer, the method comprising the steps of:
   a) receiving an input signal;
   b) splitting the input signal into a main signal and a reference signal;
   c) processing the main signal in a predistorter;
   d) amplifying the main signal to produce an amplified main signal;
   e) combining a sample of the main signal with the reference signal to produce an error signal representative of residual errors in the main signal after amplification; and
   f) training the predistorter to more accurately model the amplifier's characteristics, the predistorter being trained using the error signal;
   g) amplifying the error signal to produce an amplified error signal; and
   h) subtracting the amplified error signal from the amplified main signal to produce an output signal.

* * * * *